United States Patent [19]
Kim et al.

[11] Patent Number: 6,090,704
[45] Date of Patent: Jul. 18, 2000

[54] METHOD FOR FABRICATING A HIGH DIELECTRIC CAPACITOR

[75] Inventors: Wan-Don Kim; Byoung-Taek Lee, both of Seoul, Rep. of Korea

[73] Assignee: Samsung Electronics Co., Ltd., Suwon, Rep. of Korea

[21] Appl. No.: 09/113,142

[22] Filed: Jul. 10, 1998

[30] Foreign Application Priority Data

Jul. 16, 1997 [KR] Rep. of Korea ............. 97-33350

[51] Int. Cl.[7] ............. H01L 21/4763; H01L 21/44; H01L 21/8242; H01L 21/20
[52] U.S. Cl. ............. 438/650; 438/686; 438/643; 438/644; 438/239; 438/240; 438/396
[58] Field of Search ............. 438/650, 686, 438/625, 627, 628, 643, 644, 239, 240, 253, 396

[56] References Cited

U.S. PATENT DOCUMENTS

| | | | |
|---|---|---|---|
| 5,381,302 | 1/1995 | Sandhu et al. | 361/305 |
| 5,903,493 | 5/1999 | Lee | 365/149 |
| 5,972,722 | 10/1999 | Visokay et al. | 438/3 |

*Primary Examiner*—Wael Fahmy
*Assistant Examiner*—Neal Berezny
*Attorney, Agent, or Firm*—Jones Volentine, L.L.P.

[57] ABSTRACT

A method for fabricating a semiconductor device using a high dielectric material as a dielectric film of a capacitor wherein an etch stopping layer such as BST having a good dry etch selectivity with respect to an interlayer insulating film is formed on the adhesion layer formed on an upper electrode. This etch stopping layer prevents the upper electrode of a capacitor from being exposed to be etched during forming a metal contact.

16 Claims, 4 Drawing Sheets

METHOD FOR FABRICATING A HIGH DIELECTRIC CAPACITOR

FIELD OF THE INVENTION

The present invention relates to a method for fabricating a semiconductor device, and more particularly relates to a method for fabricating a semiconductor device for preventing the degrading of capacitor characteristics and simplifying the manufacturing process.

BACKGROUND OF THE INVENTION

Recently, a high dielectric material such as BST, PZT, PLZT, or the like having a dielectric constant more than ten to hundred times that of a conventional dielectric film has been widely used as a dielectric film of highly integrated circuits.

In the case of forming a capacitor using the high dielectric material mentioned above, new materials such as Pt, Ru, $RuO_2$, Ir, and $IrO_2$ having relatively good oxidation resistant characteristics compared with a conventional polysilicon electrode, have been adopted as electrode materials.

Accordingly, the high dielectric materials(i.e.,BST, PZT, PLZT, or the like) and the new electrode materials(i.e., Pt, Ru, $RuO_2$, Ir, and $IrO_2$) mentioned above have been used to form a capacitor so as to acquire an available capacitance and a low leakage current. However, in this case, the electrode materials are etched due to a cleaning process performed in subsequent processes of forming a metal contact. Also, metal line materials such as Ti react with the electrode materials and diffuse into the electrode materials, thus transforming an upper surface layer of the electrode.

Therefore, to solve above problems, the adhesion materials such as TiN, TiSiN, polysilicon, or the like are used as an adhesion layer so as to cap the upper electrode, disposing an interlayer insulating film thereon.

FIG. 1 is a cross-sectional view showing a conventional semiconductor device having a high dielectric film.

In FIG. 1, a semiconductor substrate is identified with reference number 10, interlayer insulating films 12, 26, a polysilicon plug 14, adhesion metal layers 16, 24, a lower electrode 18, a dielectric film 20, an upper electrode 22, and a metal line 28.

In accordance with above semiconductor device, the adhesion metal layer 24 caps the upper surface of the upper electrode 22 to prevent the upper electrode 22 from being attacked by the metal line 28. However, the adhesion metal line 24 does not have a good dry etch selectivity with respect to the interlayer insulating film 12, 26, thus resulting in difficulty in forming a metal contact.

In other word, the process for forming the metal contact 28 to the semiconductor substrate 10 and to the upper electrode 22 is performed after the interlayer insulating film 26 is deposited over the capacitor. In case of capping the upper electrode 22 with an adhesion material 24 such as TiN, TiSiN, or the like, disposing the interlayer insulating film 26 thereon, so as to improve adhesion between the upper electrode 22 and the interlayer insulating film 26, as shown in FIG. 1, the adhesion material 24 may be over-etched (reference number 30) due to low dry etch selectivity with respect to an oxide layer used as the interlayer insulating film 26.

When the adhesion material 24 is over etched, the metal line material 28, such as Ti directly contacts to the upper electrode 22 and is diffused into the upper electrode 22 in subsequent process, thus transforming the upper surface layer of the upper electrode 22 and degrading the capacitor characteristics.

To solve the problems mentioned above, a polysilicon layer having a good dry etch selectivity with respect to the oxide layer used as for the interlayer insulating film 12, 26 can be adopted as the adhesion material 24. However, in case of the polysilicon layer, the polysilicon layer is deposited on the upper electrode 22 under the high temperature. As a result, the lower adhesion material 16 beneath the lower electrode 18 is easily oxidized under the high temperature, thus increasing dielectric leakage.

Another method has been proposed to solve the problems. The method employs an additional photolithography process, thus forming a metal contact to the semiconductor substrate and to the upper electrode by a different photolithography process. In other word, the metal contact to the semiconductor substrate and the metal contact to the upper electrode are not formed simultaneously by one photolithography process. As a result in this method, it is an inevitable the problem that the cost increases due to additional photolithography process and the process becomes complicated.

SUMMARY OF THE INVENTION

The present invention is intended to solve the problems, and it is an object of the invention to provide a method for fabricating a semiconductor device preventing capacitor characteristics from being degraded during forming a metal contact.

It is a further object of the invention to provide a method for fabricating a semiconductor device simplifying the process and minimizing the cost.

To accomplish the above objectives, the present invention provides a method for fabricating a semiconductor substrate, in which a material layer such as BST having a good dry etch selectivity with respect to an interlayer insulating film is deposited over an adhesion layer to function as an etch stopping layer. The method consists of forming a first interlayer insulating film on a semiconductor substrate; forming a first contact hole by etching said first interlayer insulating film to expose an upper surface of said semiconductor substrate; forming a conductive plug by filling said first contact hole with a conductive layer; sequentially forming a lower adhesion metal layer and a lower metal electrode on said first interlayer insulating film including said conductive plug; sequentially forming a dielectric film, an upper electrode, an upper adhesion metal layer, and an etch stopping layer on said first interlayer insulating film including said lower electrode; forming a second interlayer insulating film on said first interlayer insulating film including said etch stopping layer; forming a second contact hole to expose an upper surface of said etch stopping layer and a third contact hole to expose an upper surface of said semiconductor substrate by etching said second interlayer insulating film and said first interlayer insulating film, said second and third contact holes being spaced from each other; and etching said etch stopping layer beneath said second contact hole to expose an upper surface of said upper adhesion metal layer.

BRIEF DESCRIPTION OF THE DRAWINGS

This invention may be understood and its objects will become apparent to those skilled in the art by reference to the accompanying drawings as follows.

DESCRIPTION OF THE PREFERRED EMBODIMENTS

The preferred embodiment of the present invention will now be described with reference to the accompanying drawings, FIG. 2 and FIG. 3.

Figure 1:
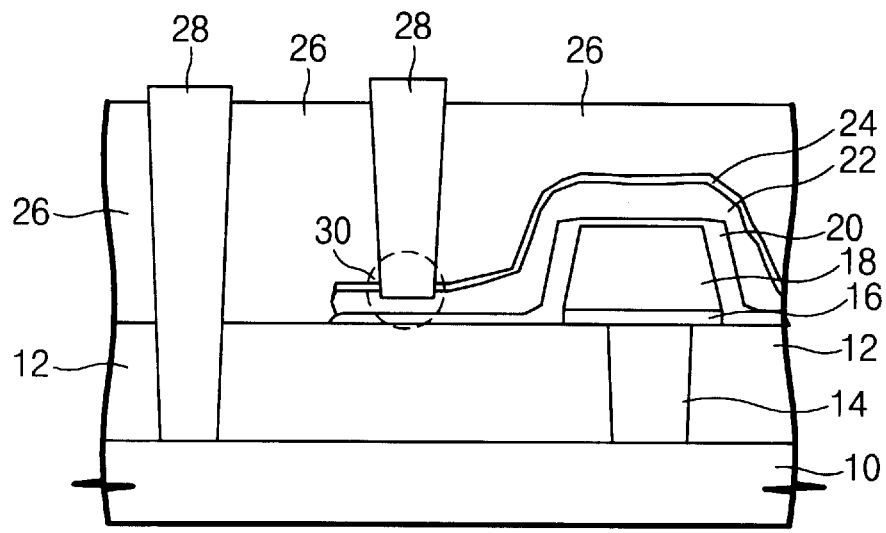
FIG. 1 is a cross-sectional view showing a conventional semiconductor device.
Figure 2:
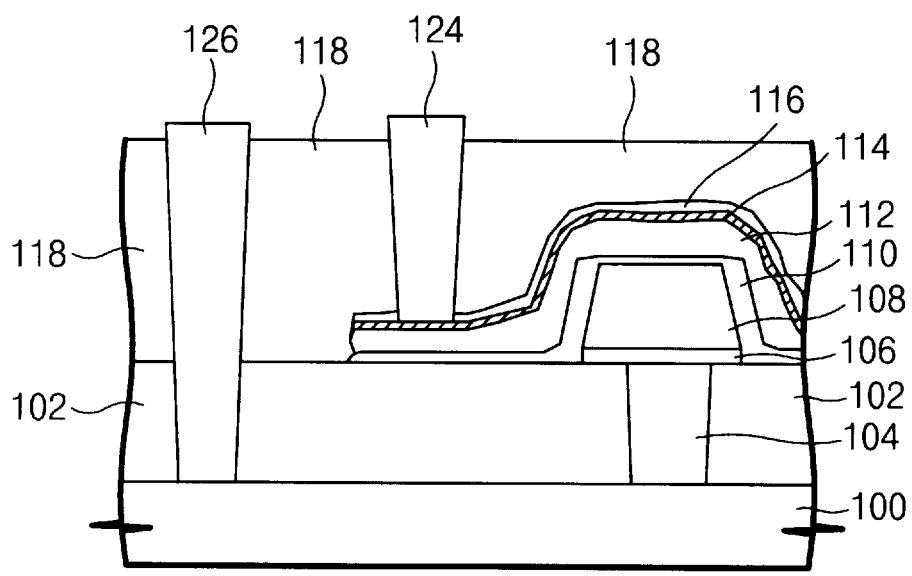
FIG. 2 is a cross-sectional view showing a novel semiconductor device according to the embodiment of the present invention.

FIG. 2 is a cross-sectional view showing a novel semiconductor device according to the embodiment of the present invention.

FIG. 3a to FIG. 3f are flow diagrams showing a novel method for forming a semiconductor substrate shown in FIG. 2.

In FIG. 2, a semiconductor substrate is identified with reference number 100, interlayer insulating films 102, 118, a polysilicon plug 104, a lower adhesion metal layer 106, an upper adhesion metal layer 114, a lower electrode 108 of a capacitor, a dielectric film 110, an upper electrode 112 of a capacitor, an etch stopping layer 116, and metal lines 124, 126.

Referring to FIG. 2, a semiconductor device is provided, in which the etch stopping layer 116 preferably comprised a material selected from a group consisting of BST, SiON, SiN and a combination thereof and is formed on the upper adhesion metal layer 114. The upper adhesion metal layer 114 is formed between the upper electrode 112 and the interlayer insulating film 118 so as to improve adhesion between these two layers.

The novel method for fabricating a semiconductor device will be described in detail with reference to FIG. 3a to FIG. 3f.

Figure 3A:
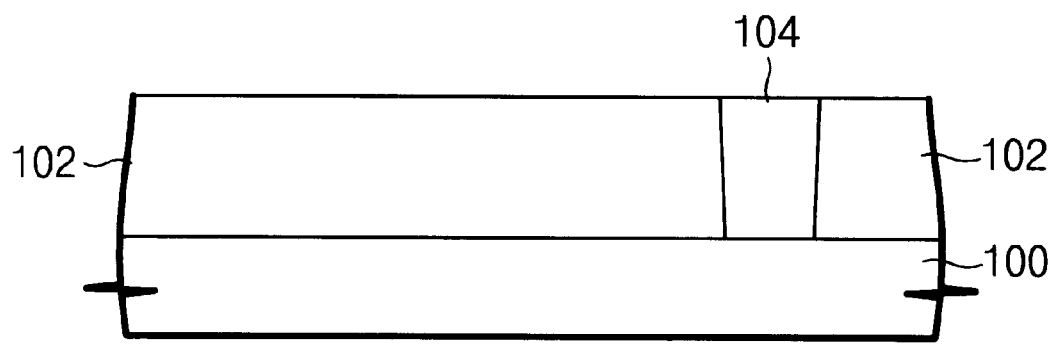
FIG. 3a to FIG. 3f are flow diagrams showing a novel method for forming a semiconductor device shown in FIG. 2.

Referring to FIG. 3a, a first interlayer insulating film 102 made of an oxide layer is formed on a semiconductor substrate 100. The first interlayer insulating film 102 is etched to form a contact hole by a known photolithography process. A polysilicon layer is deposited to fill up the contact hole and is planarization-etched to form a polysilicon plug 104.

Figure 3B:
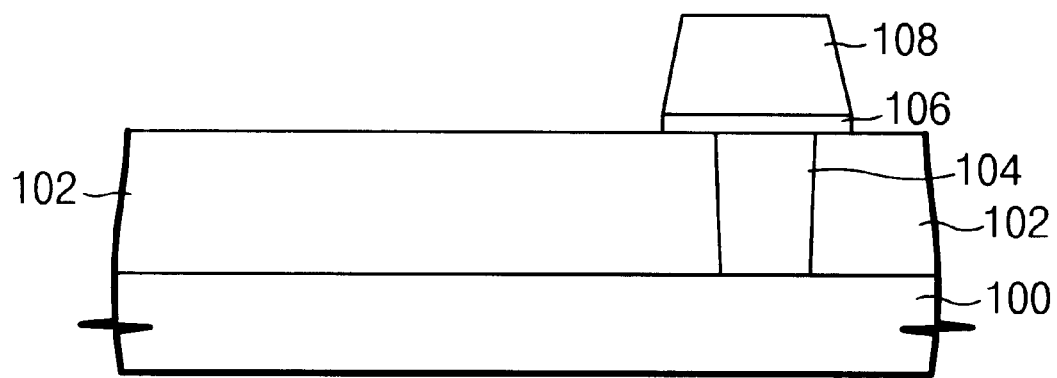

In FIG. 3b, a conductive layer used as a lower adhesion metal layer and a conductive layer used as a lower electrode of a capacitor are sequentially formed on the first interlayer insulating film 102 including the polysilicon plug 104. The conductive layers are then patterned and respectively etched to form a lower electrode 108 of a capacitor and a lower adhesion metal layer 106 formed over the semiconductor substrate 100.

Figure 3C:
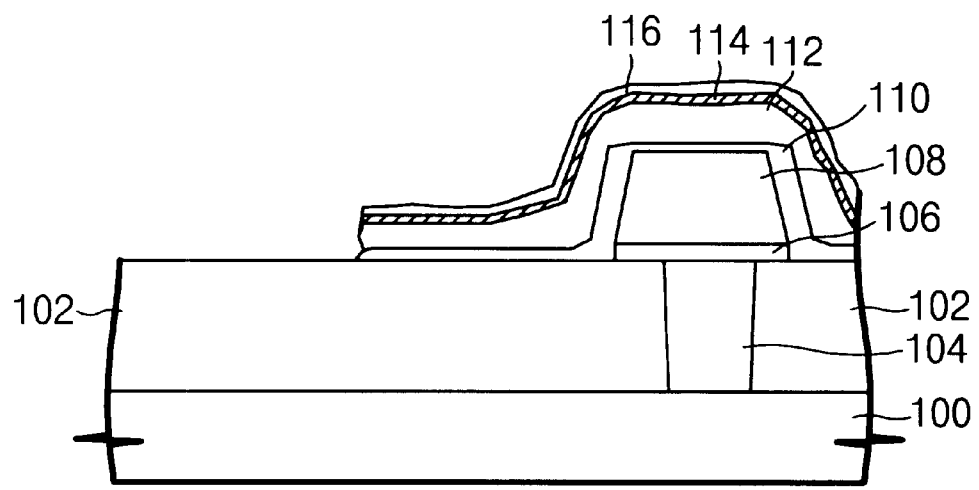

As shown in FIG. 3c, a dielectric film 110, an upper electrode 112 of a capacitor, an upper adhesion metal layer 114, and an etch stopping layer 116 are sequentially formed on the first interlayer insulating film 102 and the lower electrode 108. The upper electrode 112 preferably comprises a material selected from a group consisting of Pt, Ru, $RuO_2$, Ir, $IrO_2$, oxide material having Perovskite structure and a combination thereof. The upper adhesion metal layer 114 preferably comprises a material selected from a group consisting of TiN, TaN, TiSiN, TaSiN, TiAlN, TaAlN and combination thereof. The etch stopping layer 116 preferably comprises a material selected from a group consisting of BST, SiON, SiN and combination thereof. The etch stopping layer 116 has a relatively good etch selectivity with respect to a second interlayer insulating film 118 formed thereon in a subsequent process and is deposited at a temperature low enough not to have an effect on the semiconductor substrate 100.

Figure 3D:
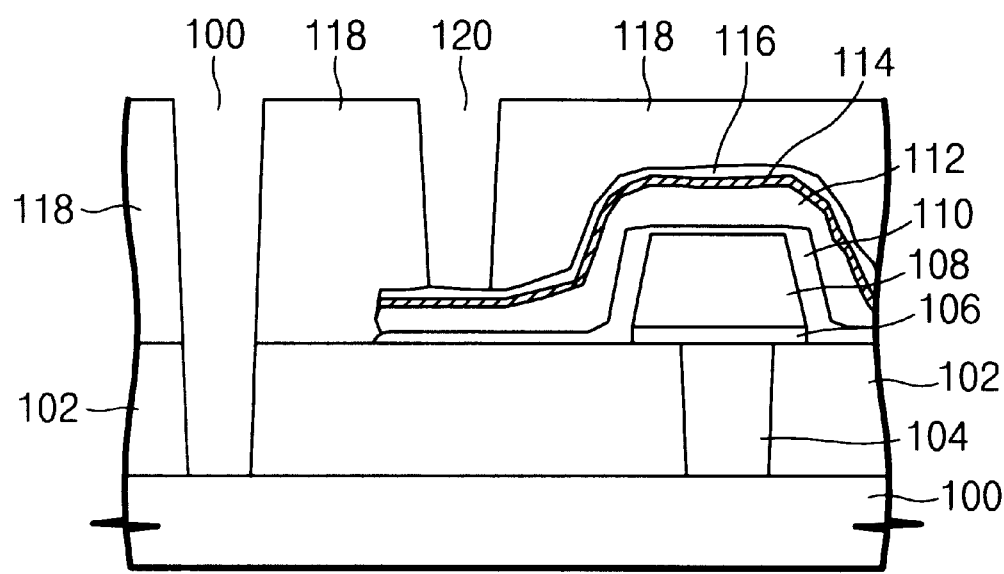

Referring to FIG. 3d, the second interlayer insulating film 118 is formed on the first interlayer insulating film 102 and the etch stopping layer 116. A photoresist layer(not shown) is formed on the second interlayer insulating film 118 and is patterned to form a photoresist pattern (not shown) so as to define a contact region for the semiconductor substrate 100 and a contact region for the upper electrode 112.

As shown in FIG. 3d, a contact hole 120 for the upper electrode 112 reaching the upper surface of the etch stopping layer 116 and a contact hole 122 for the semiconductor substrate 100 reaching the upper surface of the semiconductor substrate 100 are formed by sequentially etching the second insulating film 118 and the first interlayer insulating film 102 using the photoresist pattern as a mask.

Figure 3E:
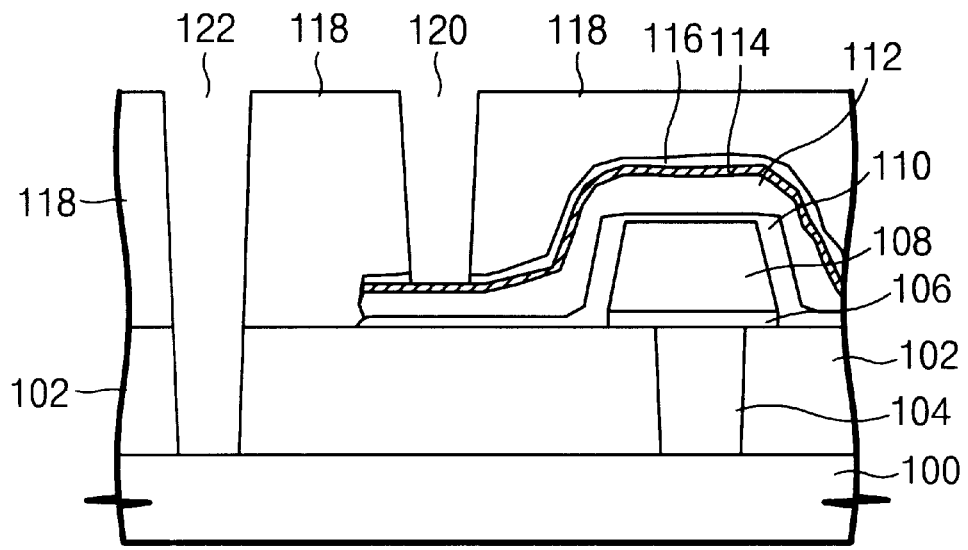

Referring to FIG. 3e, the etch stopping layer 116, which is exposed through the contact hole 120 is etched so as to expose the upper surface of the upper adhesion metal layer 114 by using the photoresist pattern as a mask. When BST is used as an etch stopping layer, for example HF is used for the etching process.

Figure 3F:
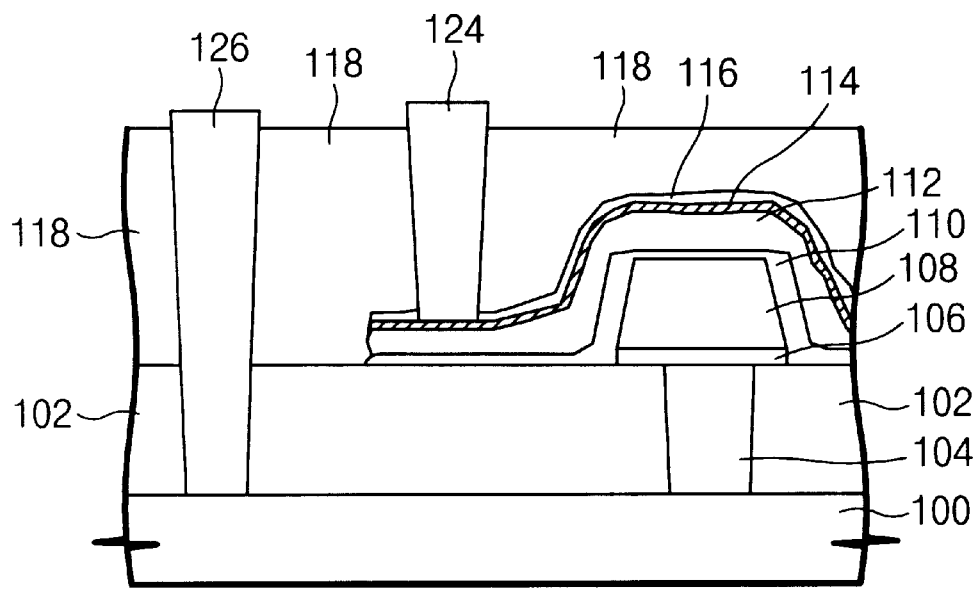

Referring to FIG. 3f, metal lines 124,126 are formed by filling the contact hole 120 for the upper electrode 112 and the contact hole 122 for the semiconductor substrate 100 with a conductive layer used as metal lines. The conductive layer preferably comprises a material selected from a group consisting of Ti, TiN, Al and a combination thereof.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a semiconductor device comprising the steps of;

forming a first interlayer insulating film over a semiconductor substrate;

forming a first contact hole by etching said first interlayer insulating film to expose an upper surface of said semiconductor substrate;

forming a conductive plug by filling said first contact hole with a conductive layer;

sequentially forming a lower adhesion metal layer and a lower electrode over said first interlayer insulating film and said conductive plug;

sequentially forming a dielectric film, an upper electrode, an upper adhesion metal layer, and an etch stopping layer over said first interlayer insulating film and said lower electrode;

forming a second interlayer insulating film over said first interlayer insulating film and said etch stopping layer;

forming second and third contact holes by etching said second interlayer insulating film and said first interlayer insulating film, said second and third contact holes respectively exposing an upper surface of said etch stopping layer and an upper surface of said semiconductor substrate and being spaced from each other; and etching said etch stopping layer beneath said second contact hole to expose an upper surface of said upper adhesion metal layer.

2. The method according to claim 1, wherein said conductive plug comprises polysilicon.

3. The method according to claim 1, wherein said upper electrode is made of a material selected from a group consisting of Pt, Ru, $RuO_2$, Ir, $IrO_2$, oxide material having Perovskite structure, and a combination of these materials.

4. The method according to claim 1, wherein said upper adhesion metal layer is made of a material selected from a group consisting of TiN, TaN, TiSiN, TaSiN, TiAlN, TaAlN, and a combination of these materials.

5. The method according to claim 1, wherein said etch stopping layer is made of a material selected from a group consisting of BST, SiON, SiN, and a combination of these materials, said etch stopping layer having a relatively good etch selectivity with respect to said second interlayer insulating film.

6. The method according to claim 1, further comprising the steps of forming a first metal line by depositing a first conductive material into the second contact hole; and forming a second metal line by depositing a second conductive material into the third contact hole.

7. The method according to claim 6, wherein the first conductive material comprises a material selected from the group consisting of Ti, TiN, Al, and a combination of these materials.

8. The method according to claim 6, wherein the second conductive material comprises a material selected from the group consisting of Ti, TiN, Al, and a combination of these materials.

9. A method for fabricating a semiconductor device, comprising the steps of:

forming a first interlayer insulating film over a semiconductor substrate;

forming a plug contact hole by etching the first interlayer insulating film to expose an upper surface of the semiconductor substrate;

forming a conductive plug by filling the plug contact hole with a conductive plug material;

forming a capacitor over the first interlayer insulating film and the conductive plug;

forming an etch stopping layer over the first interlayer insulating film and the capacitor;

forming a second interlayer insulating film over the first interlayer insulating film and the etch stopping layer;

forming first and second line contact holes by etching the second interlayer insulating film and the first interlayer insulating film, the first and second line contact holes respectively exposing an upper surface of the etch stopping layer and an upper surface of the semiconductor substrate and being spaced from each other; and etching the etch stopping layer beneath the first line contact hole to expose an upper surface of the capacitor.

10. The method according to claim 9, wherein the conductive plug material comprises polysilicon.

11. The method according to claim 9, wherein the upper electrode comprises a material selected from a group consisting of Pt, Ru, $RuO_2$, Ir, $IrO_2$, an oxide material having Perovskite structure, and a combination of these materials.

12. The method according to claim 9, wherein the upper adhesion metal layer comprises a material selected from a group consisting of TiN, TaN, TiSiN, TaSiN, TiAlN, TaAlN, and a combination of these materials.

13. The method according to claim 9, wherein the etch stopping layer comprises a material selected from a group consisting of BST, SiON, SiN, and a combination of these materials, and wherein the etch stopping layer having a good etch selectivity relative to the second interlayer insulating film.

14. The method according to claim 9, further comprising the steps of forming a first metal line by depositing a first conductive line material into the first line contact bole; and forming a second metal line by depositing a second conductive line material into the second line contact hole.

15. The method according to claim 14, wherein the first conductive line material comprises a material selected from the group consisting of Ti, TiN, Al, and a combination of these materials.

16. The method according to claim 14, wherein the second conductive line material comprises a material selected from the group consisting of Ti, TiN, Al, and a combination of these materials.

* * * * *